(12) United States Patent
Wang et al.

(10) Patent No.: US 7,838,432 B2
(45) Date of Patent: Nov. 23, 2010

(54) ETCH PROCESS WITH CONTROLLED CRITICAL DIMENSION SHRINK

(75) Inventors: Judy Wang, Cupertino, CA (US); Shin-Li Sung, Campbell, CA (US); Shawming Ma, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 705 days.

(21) Appl. No.: 11/735,938

(22) Filed: Apr. 16, 2007

(65) Prior Publication Data

US 2008/0254638 A1    Oct. 16, 2008

(51) Int. Cl.
*H01L 21/302* (2006.01)

(52) U.S. Cl. .................. 438/714; 438/692; 438/700; 438/745; 216/37; 216/49; 216/67

(58) Field of Classification Search ............... 438/714, 438/692, 700, 745; 216/49, 37, 67; 430/316, 430/30, 311, 317
See application file for complete search history.

(56) References Cited

U.S. PATENT DOCUMENTS 5,933,759 A * 8/1999 Nguyen et al. .............. 438/700
6,753,264 B2   6/2004 Li et al.
7,122,480 B2  10/2006 Li et al.
2004/0072430 A1   4/2004 Huang et al.
2004/0192060 A1   9/2004 Stegemann et al.
2005/0255703 A1  11/2005 Sato

* cited by examiner

*Primary Examiner*—Lan Vinh
*Assistant Examiner*—Maki A Angadi
(74) *Attorney, Agent, or Firm*—Blakely, Sokoloff, Taylor & Zafman (57) ABSTRACT

Methods to etch an opening in a substrate layer with reduced critical dimensions are described. A multi-layered mask including a lithographically patterned photoresist and an unpatterned organic antireflective coating (BARC) is formed over a substrate layer to be etched. The BARC layer is etched with a significant negative etch bias to reduce the critical dimension of the opening in the multi-layer mask below the lithographically define dimension in the photoresist. The significant negative etch bias of the BARC etch is then utilized to etch an opening having a reduced critical dimension into the substrate layer. To plasma etch an opening in the BARC with a significant negative etch bias, a polymerizing chemistry, such as $CHF_3$ is employed. In a further embodiment, the polymerizing chemistry provide at low pressure is energized at a relatively low power with a high frequency capacitively coupled source.

18 Claims, 5 Drawing Sheets

ETCH PROCESS WITH CONTROLLED CRITICAL DIMENSION SHRINK

BACKGROUND

1. Field

Embodiments of the present invention relate to the electronics manufacturing industry and more particularly to the process of etching a workpiece with a plasma etch tool.

2. Discussion of Related Art

As high volume manufacturing of microelectronics reaches the 65 nanometer (nm) technology node, the critical dimension (CD) requirement of all features in the front end of line (FEOL) and back end of line (BEOL) becomes increasingly demanding. 65 nm features are typically much smaller than the lithographically printed dimension. The standard technique for shrinking a lithographically defined dimension is pattern trimming, which is extensively used to extend the life of a given lithography technology. Pattern trimming removes a portion of the mask pattern, making the pattern smaller. This technique however is only useful for line patterns and not spaces between lines or via openings because the spaces between the lines and via openings only get larger when pattern trimming is performed. Thus, while the gate electrode patterning and etching processes are able to employ pattern trimming to achieve a sub-65 nm gate CD, contact or via patterning and etching processes have difficulty reaching sub-100 nm dimensions. Therefore, the trench and via CDs in the BEOL have become a critical path to further scaling of logic and/or memory circuits.

Forming a sloped via profile in the layer etched during the main etch operation is a conventional method for reducing a via CD to less than the lithographically defined mask CD. The layer etched during the main etch is referred to herein as a "substrate layer." An example of a substrate layer is an interlevel dielectric (ILD) layer employed in the BEOL. Generally, a sloped via profile can be achieved by etching the substrate layer with an etchant comprising a polymerizing process gas that deposits on the via sidewalls at an increasing rate as the etch front proceeds deeper into the layer during the etch (i.e. the via aspect ratio increases). The polymer deposition provides a slope reducing the CD at the bottom of the via relative to the CD at the top of the via etched into the substrate layer. In high volume manufacturing however, the main etch profile tapering method is limited by the phenomena known as "etch-stop," wherein the etch front fails to advance with additional etch time once a particular aspect ratio is reached in the substrate layer. Etch-stop generally occurs when polymer begins to accumulate at the via bottom as well as the via sidewall. The amount of etch profile tapering is limited by the aspect ratio of the via and therefore the magnitude of the via CD reduction possible from profile tapering declines as the lithographically defined via mask opening (i.e. top CD) shrinks. Thus, for a via mask with a lithographic CD of approximately 120 nm, process interactions in the main etch limit the via CD reduction achievable to somewhat less than 20 nm (i.e. less than 20%), as measured between the bottom of the via etched into the substrate layer and the lithographically defined mask CD.

SUMMARY

Methods of etching an opening in a substrate layer with reduced critical dimensions are described herein. In one embodiment of the present invention, a multi-layered mask including a lithographically patterned photoresist and an unpatterned organic antireflective coating (BARC) is formed over a substrate layer to be etched. In a further embodiment, the multi-layered mask also includes an unpatterned amorphous carbon layer between the BARC and over the substrate layer. The BARC is etched with a significant negative etch bias to reduce the critical dimension of the opening in the multi-layer mask below the lithographically defined dimension in the photoresist. In an embodiment, the significant negative etch bias of the BARC etch is then utilized to etch an opening having a reduced critical dimension in the amorphous carbon layer of the multi-layered mask. The significant negative etch bias of the BARC etch is then utilized to etch an opening having a reduced critical dimension into the substrate layer below the multi-layered mask. In a particular embodiment, the CD shrink from the BARC etch is significantly greater than that achievable by tapering the etch profile in the substrate layer during a main etch operation. In a further embodiment, the CD shrink from the BARC etch is combined with a CD shrink from a tapered profile in the substrate layer.

To plasma etch an opening in the BARC with a significant negative etch bias, a polymerizing chemistry is provided to an etch chamber at a low pressure. In a particular embodiment, a polymerizing chemistry comprising $CHF_3$ is employed. In a further embodiment, the polymerizing chemistry is energized at a relatively low power with a high frequency capacitively coupled source operating at between 100 MHz and 180 MHz. In one such embodiment, a 162 MHz capacitively coupled source energizes a plasma with less than 350 W of power, normalized to a 300 mm electrode. In an alternate embodiment, the polymerizing chemistry is energized at a relatively high power with a low frequency capacitively coupled source operating at between 50 MHz and 100 MHz. In one such embodiment a 60 MHz capacitively coupled source energizes a plasma with more than 400 W of power, normalized to a 300 mm electrode.

BRIEF DESCRIPTION OF THE DRAWINGS

Embodiments of the present invention are illustrated by way of example, and not limitation, in the figures of the accompanying drawings in which.

DETAILED DESCRIPTION

Embodiments of plasma etching methods are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor processes and manufacturing techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 1:
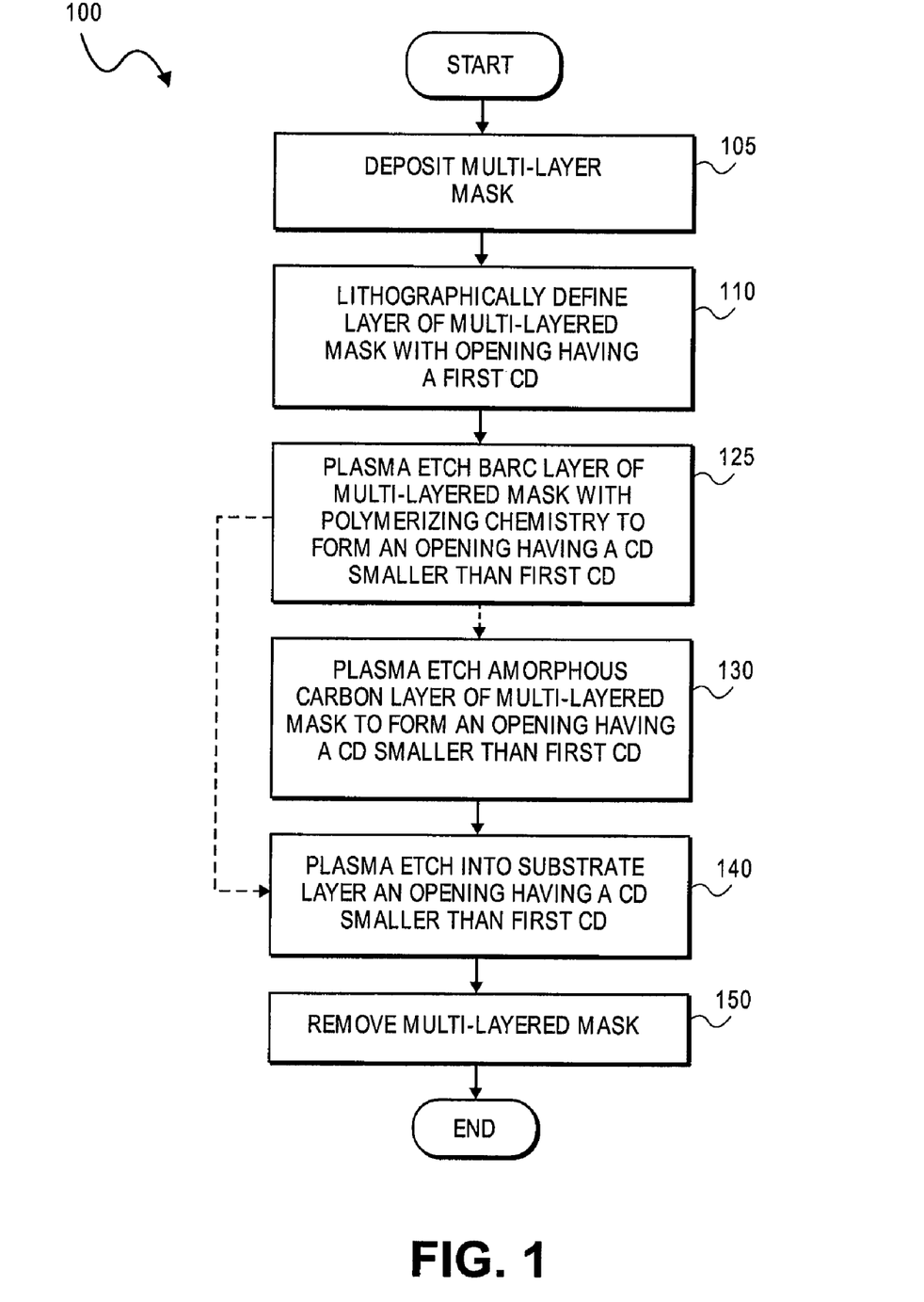
FIG. 1 illustrates a flow chart of a method of etching an opening in a substrate layer in accordance with a particular embodiment of the present invention.

FIG. 1 illustrates a flow chart of method 100 for etching a via performed upon a workpiece in accordance with an embodiment of the present invention. As used herein, a "via" encompasses embodiments having an approximately equal length and cross-sectional width as well as those having a length dimension much longer than a cross-sectional width dimension (i.e. a slot or trench). Similarly, the depth of the "via" may vary in different embodiments. FIGS. 2A-2F illustrate cross-sectional views of a workpiece having a feature fabricated in accordance with an embodiment of the present invention and are referred to as the operations of method 100 illustrated in FIG. 1 are described.

The method 100 of FIG. 1 starts with a substrate layer 220 (FIG. 2A) over a support 210. In one embodiment, support 210 is a semiconductor wafer, such as, but not limited to silicon, germanium, or a commonly known III-V compound semiconductor material. In another embodiment, support 210 is a glass, quartz, or sapphire material. Substrate layer 220 generally comprises the layer in which an opening is ultimately desired. A substrate layer is distinguished from a masking layer, a masking layer being a temporary layer employed to transfer a pattern into the substrate layer. In the exemplary embodiment depicted in FIG. 1, substrate layer 220 of FIG. 2A-2F is a dielectric layer, such as a nitride layer, an oxide of silicon layer, or a low-k material layer. In another embodiment, substrate layer comprises a semiconductor layer or conductor layer, such as silicon, germanium, tantalum, titanium, tungsten or other commonly known materials. In still other embodiments, the substrate layer may further comprise multiple layers of dielectric and/or semiconductor and/or conductor materials, as commonly known in the art.

Figure 2A:
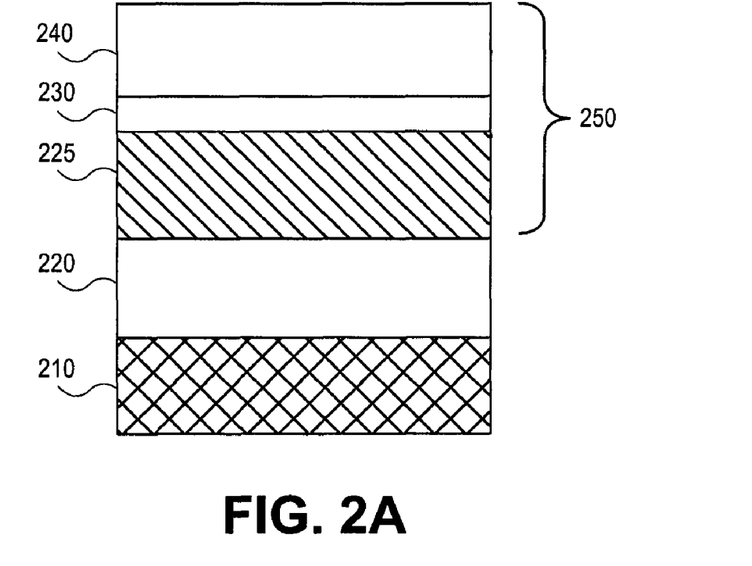
FIG. 2A illustrates a cross sectional view of a substrate after deposition of a multi-layered mask in accordance with one embodiment of the present invention.

At operation 105 of FIG. 1, a multi-layered mask is deposited on the substrate. In the embodiment depicted in FIG. 1, the multi-layered mask includes a patterning layer capable of withstanding temperatures above 300° C. and preferably above 350° C. In one embodiment the high temperature resistant patterning film is a CVD carbon film. The CVD carbon material comprises carbon with sp1, sp2 and sp3 bonding states giving the film properties which are a hybrid of those typical of pyrolytic, graphitic, and diamond-like carbon. Because the CVD carbon material may contain a plurality of bonding states in various proportions, it is commonly referred to as "amorphous carbon." Amorphous carbon layer 225 of FIG. 2A is formed upon substrate layer 220 as the first layer of a multi-layered mask. An amorphous carbon material is commercially available from Applied Materials, Inc., CA, U.S.A. under the trade name Advanced Patterning Film™ (APF). Amorphous carbon layer 225 is not photosensitive and instead is defined with a plasma etch to reproduce with high fidelity the pattern of an overlying photosensitive layer. While amorphous carbon layer 225 provides additional thickness to the mask much like a traditional hard mask (employing a nitride or oxide of silicon), it is advantageous because the amorphous carbon layer 225 can be readily removed with the same methods used to remove a photosensitive layer, for example, an $O_2$ plasma ash. Thus, because no additional mask removal operations are required, process complexity is reduced relative to the traditional hard mask process. In one embodiment, the amorphous carbon layer is an inorganic carbon material formed to a thickness between 100 Å and 3000 Å using a PECVD process. In a particular embodiment, layer 225 is approximately 2000 Å thick to increase the total thickness of the mask over the substrate layer 220 without requiring a photolithographic process to define the entire mask thickness. The amorphous carbon layer may also include nitrogen or other additives. Furthermore, the resistance to high temperature allows a dielectric capping layer, such as a dielectric anti-reflective coating (DARC), to be deposited on over the amorphous carbon layer at typical dielectric deposition temperatures of at least 300° C.

Embodiments including a DARC may employ a silicon nitride, silicon oxide, or silicon oxynitride (SiON) having a thickness dependant on the optical properties of the DARC material composition and the wavelength employed for photolithography. Typically, the DARC is between 300 Å and 100 Å and in a particular embodiment, a SiON DARC of approximately 600 Å is employed. In a further embodiment, the DARC is deposited as a recipe step performed in a single deposition system in conjunction with the CVD carbon deposition.

The multi-layered mask deposited includes a bottom anti-reflective coating (BARC). As shown in FIG. 2A, BARC 230 is applied over amorphous carbon layer 225 (or over a DARC layer). BARC 230 is an organic material, such as, but not limited to polyamides and polysulfones. BARC reduces reflection of light during patterning of the photosensitive layer and is also useful for thinner photoresist coatings because the BARC layer increases the total thickness of the multi-layered mask 250 for improved etch resistance during etch of underlying substrate layer 220. Generally, BARC 230 must have sufficient thickness to extinguish the light used for exposure and typically ranges from 100 Å to more than 800 Å. For a 193 nm embodiment, the thickness is approximately 800 Å.

Over BARC 230, a photosensitive layer (photoresist) is coated. Thus, as shown in FIG. 2A, photoresist 240 is separated from the amorphous carbon layer 225 by BARC 230. Photoresist 240 and BARC 230 form what is commonly referred to as a "bi-layer" mask. In an embodiment, patterned photoresist 240 is a conventional acrylate composition with a thickness between 2000 Å and 6000 Å. In an alternate embodiment, patterned photoresist 240 is siloxane and silsesquioxane (SSQ) based with a thickness between 1000 Å-2000 Å.

Figure 2B:
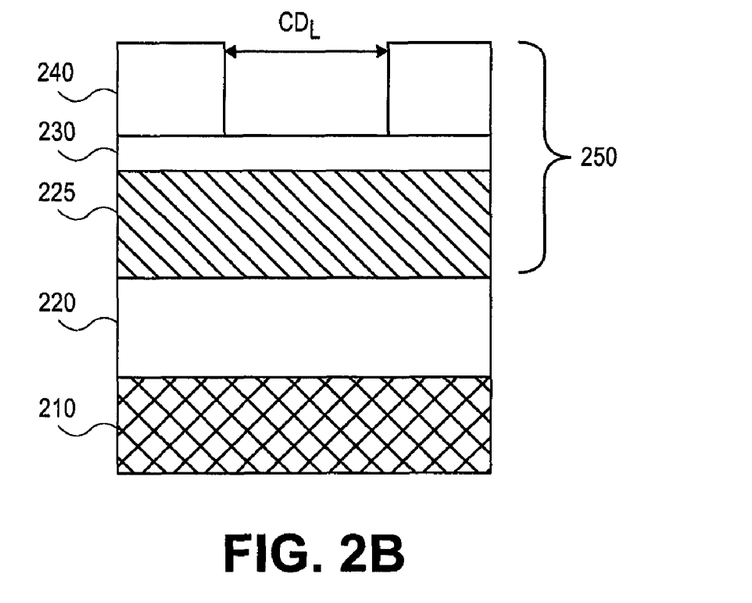
FIG. 2B illustrates a cross-sectional view of the substrate of FIG. 2A with a lithographically defined opening in one of the layers of the multi-layered mask in accordance with one embodiment of the present invention.

In operation 110 in FIG. 1, an opening is lithographically defined in photoresist 240. In one embodiment, referring to FIG. 2B, photoresist 240 is patterned with a conventional 193 nm exposure/develop lithography process to define an opening having a first critical dimension, $CD_L$, below 100 nm. In a specific embodiment, patterned photoresist 240 forms an opening having a first critical dimension between approximately 50 nm and 90 nm. As shown in FIG. 2B, organic BARC 230 remains unpatterned after the exposure and develop processes, as does amorphous carbon layer 225.

Figure 2C:
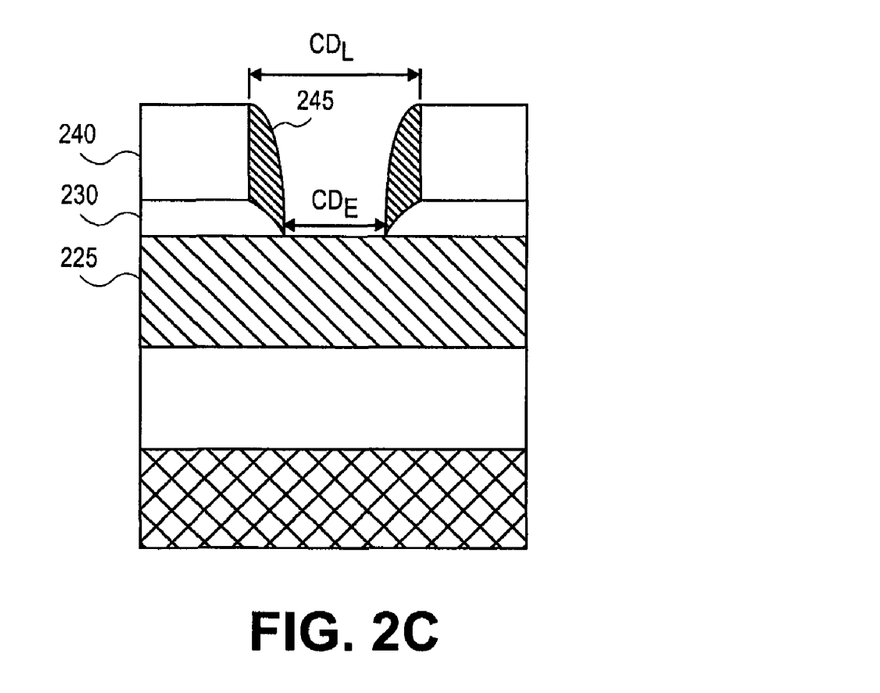
FIG. 2C illustrates a cross-sectional view of the substrate of FIG. 2A with an etched opening in an organic anti-reflective layer of the multi-layered mask in accordance with one embodiment of the present invention.

Next, at BARC etch operation 125, the BARC is plasma etched to form an opening smaller than the lithographically defined opening in the photoresist. Referring to FIG. 2C, the BARC plasma etch is performed under process conditions that form an opening in BARC 230 having a critical dimension at the bottom of BARC 230, $CD_E$, smaller than the lithographically defined critical dimension, $CD_L$. In an embodiment, the BARC etch process conditions are selected to deposit polymer 245 on the sidewalls of photoresist 230 to shrink the lithographically defined opening in photoresist 230 to the desired sub-lithographic critical dimension, $CD_E$. The delta of $CD_E$ minus $CD_L$ is referred to herein as etch bias and is therefore a negative number when the critical dimension of the opening etched in the BARC is smaller than the lithographically defined opening the photoresist. In a particular embodiment, because the BARC is relatively thin, typically less than 1000 Å, a highly polymerizing process condition is utilized to achieve a significant etch bias during the BARC etch. In an embodiment, the BARC etch process conditions are provided to shrink the lithographically defined critical dimension, $CD_L$, by between 10 nm and 60 nm (i.e. an etch bias of between −10 nm and −60 nm). In a particular embodiment, the critical dimension shrink is at least 20% of the lithographically defined critical dimension, $CD_L$. In one such embodiment, the etch bias is approximately −50 nm for a lithographically defined opening having a $CD_L$ of approximately 100 nm. In another embodiment, wherein $CD_L$ is approximately 50 nm, the etch bias is approximately −10 nm to form a BARC etched opening having a $CD_E$ of approximately 40 nm.

Because the BARC etch is the first etch defining multi-layered mask 250, the CD shrink in BARC 230 provides a mask to a subsequent etch of amorphous carbon 225 and/or substrate layer 220. As previously discussed, the BARC layer is relatively thin, typically between 100 Å and 500 Å, so deposition of sidewall polymer during the etch of the BARC can cause a tapered profile over only a small thickness. Thus, a relatively large amount of sidewall polymer may be deposited during the BARC etch without causing an appreciable amount of sidewall taper in an underlying layer subsequently etched. Additionally, during the BARC etch, the aspect ratio is still relatively low, mitigating process concerns such as etch stop. Furthermore, in embodiments employing amorphous carbon layer 225, the BARC layer CD shrink provides a masking polymer that provides good etch resistance to the subsequent process used for etching the amorphous carbon layer, enabling a controllable nearly vertical via profile through the amorphous carbon layer. These benefits contribute to good repeatability of both profile and low CD range. As still another benefit, the BARC layer CD shrink provides a means to reduce the CD of the multi-layered mask independent of the process used to etch substrate layer 220. Thus, a process capable of etching substrate layer 220 to form a via with a tapered sidewall in substrate layer 220 may be combined with the BARC CD shrink to achieve a final bottom CD much smaller than the lithographically defined CD.

The plasma etch process employed at BARC etch operation 125 of FIG. 1 comprises a polymerizing process gas capable of generating $CF_2$ species when energized to a plasma. Generation of $CF_2$ species during the plasma etch of the BARC is beneficial for shrinking the CD of the BARC opening from that of the photoresist to provide a significant etch bias. Generally, increasing the flow rate of the polymerizing process gas has the effect of increasing the BARC etch bias. However, as discussed below the magnitude of the etch bias is also dependent on a number of other process parameters. In an embodiment, the polymerizing process gas is fully halogenated, such as octafluorocyclobutane ($C_4F_8$), octafluorocyclopentene ($C_5F_8$), hexafluorobenzene ($C_6F_6$), and hexafluorobutadiene ($C_4F_6$).

In another embodiment the polymerizing process gas is partially halogenated, such as hexafluorocyclobutanone ($C_4F_6O$) and difluoromethane ($CH_2F_2$). In a particular embodiment the polymerizing process gas is trifluoromethane ($CHF_3$) introduced into the etch chamber at a flow rate of between 5 standard cubic centimeters per minute (sccm) and 50 sccm.

In a further embodiment, the BARC plasma etch operation 125 additionally comprises a non-polymerizing process gas. Generally, the non-polymerizing process gas tends to produces fewer $CF_2$ species than the polymerizing process gas and provides a further means to control the vertical etch rate of the BARC layer relative to the photoresist layer and relative to the rate of sidewall polymer deposition. In an embodiment, the non-polymerizing process gas is $CF_4$. In an exemplary implementation employing $CHF_3$ at a flow rate of between 5 sccm and 50 sccm, $CF_4$ is introduced into the etch chamber at a flow rate sufficient to provide a $CF_4:CHF_3$ ratio of between 0.3:1 and 1.5:1.

The BARC etch operation 125 may additionally include a carrier gas, which may further serve a role in sidewall polymer formation. In an embodiment, the carrier gas is nitrogen ($N_2$) having a flow rate relative to the polymerizing process gas of between 0.3 and 1.0. Furthermore, it is noted that in alternate embodiments, the $N_2$ source may also be ammonia ($NH_3$). An alternative carrier and/or passivating gas is helium (He).

In an embodiment, BARC etch operation 125 is preformed at a low process pressure to increase the magnitude of etch bias. From optical emission spectroscopy, it was found lower process pressure increases the $CF_2$ species density in the plasma. Lower pressure also increases the bias voltage, improving ion directionality, which may further provide for higher net accumulation of isotropicly deposited neutral polymer species on the sidewalls of the photoresist. As the flow rate of polymerizing process gas decreases, lower process pressure has a greater effect on the magnitude of etch bias. Thus, with lower polymerizing gas flow rate, the amount by which the BARC opening is smaller than the masking layer varies more over a given pressure range. In an embodiment, the process pressure is less than 25 milliTorr (mT). In a particular embodiment, the pressure is approximately 10 mT.

In one embodiment, the BARC etch plasma is energized with a capacitively coupled RF source. Generally, the magnitude of etch bias in the BARC etch is dependent on both the frequency and the power of the capacitively coupled source. In one embodiment, a high frequency source, between 100 MHz and 180 MHz is employed to energize the plasma. In one such embodiment, a 162 MHz source is employed. A high frequency capacitively coupled source advantageously increases the magnitude of etch bias in the BARC etch for a given source power relative to lower frequency sources. The high frequency capacitively coupled source enables a higher ion density and also increases the $CF_2$ density in the plasma. This efficient generation of $CF_2$ species contributes to a greater CD shrink in the BARC layer by providing a higher net accumulation of isotropicly deposited neutral polymer species on sidewalls. Relatively low source powers are also advantageous because increasing source power also increases the erosion rate of photoresist 240. In an embodiment, the high frequency source delivers a power between 200 and 400 watts (W), normalized to a etch chamber having an electrode approximately 300 mm in diameter (e.g. an etch tool adapted for 300 mm semiconductor wafers). In a further embodiment a low frequency bias power, operating at a frequency between 2 and 60 MHz provides between 100 W and 400 W of additional power to the plasma. The low frequency bias power provides few $CF_2$ species but advantageously provides ion directionality. In a particular embodiment, a 162 MHz generator delivering between 200 W and 350 W source power and a 13.56 MHz generator delivering approximately 400 W bias power energizes 50 sccm $CHF_3$ and 50 sccm $CF_4$ at a pressure of 10 mT to plasma etch a BARC layer with a BARC etch rate of about 400Å/min with a CD shrink of approximately 50 nm.

As previously mentioned, both the frequency and power of the capacitively coupled source have an effect on the magnitude of etch bias in the BARC etch operation 125. A low frequency capacitively coupled source, such as one operating between 50 MHz and 100 MHz, may be employed to energize the plasma. In one embodiment, the low frequency source may be operated at a relatively high power of at least 400 W to provide a significant CD shrink during the BARC etch. The higher power can offset, at least partially, the lower ion density and $CF_2$ species density associated with the lower frequency source. Because of this lower ion density and CF2 species density, however, a capacitively coupled source operating at a frequency of at least 60 MHz is advantageous. In a particular embodiment, a 60 MHz RF generator delivering approximately 500 W source power energizes 50 sccm of $CHF_3$ and 50 sccm $CF_4$ at a pressure of 10 mT to plasma etch a BARC layer with a CD shrink of approximately 40 nm.

The polymerizing BARC etch process may further be applied to clear a DARC after etching through the BARC. As previously discussed, embodiments employing a DARC typically include between 400 Å and 600 Å of dielectric below BARC 230. Because the polymerizing BARC etch processes previously described have a relatively high dielectric etch rate, the thin DARC is quickly cleared and there is little need to change the plasma etch process conditions from those optimal for the BARC etch.

Figure 2D:
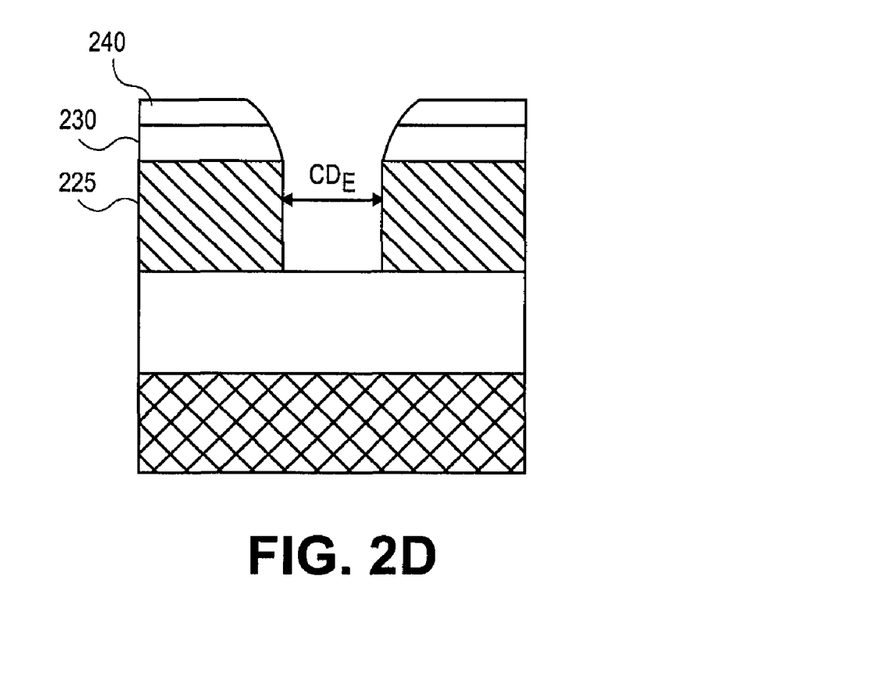
FIG. 2D illustrates a cross-sectional view of the substrate of FIG. 2A with an etched opening in an amorphous carbon layer of the multi-layered mask in accordance with one embodiment of the present invention.

Next, at operation 130 of FIG. 1, the amorphous carbon layer is etched to complete the definition of the multi-layered mask. Generally, to avoid a significant profile slope in the amorphous carbon layer 225, the etch process should have sufficiently high selectivity to sidewall polymer 245, protecting BARC 230 (shown in FIG. 2C). As shown in FIG. 2D, etching the amorphous carbon layer 225 removes most of photoresist layer 240. Depending on the thickness of photoresist layer 240, amorphous carbon layer 225, and the selectivity to photoresist of both the BARC etch and the amorphous carbon etch, more or less photoresist remains after the amorphous carbon layer is etched. In a particular embodiment employing a 2000 Å thick photoresist 240, a 400 Å thick BARC 230, and a 2000 Å thick amorphous carbon layer 225, substantially all of photoresist 240 and BARC 230 is removed during the etch of the amorphous carbon layer 225. Because the CD shrink from the polymerizing BARC etch is independent of the amorphous carbon etch, the process conditions for the amorphous carbon etch may be optimized separately from the process conditions for the polymerizing BARC etch. In one embodiment, the critical dimension of the opening etched into amorphous carbon layer 225 is approximately equal to the reduced critical dimension, $CD_E$, of the opening in BARC 230. To retain substantially all of the CD shrink from the polymerizing BARC etch, the amorphous carbon layer 225 of FIG. 2D is etched with a commonly known amorphous carbon etch process comprising an alkane, alkene, or alkyne. In on such embodiment, the etchant includes a hydrocarbon having at least two carbons, such as $C_2H_6$. In the particular embodiment employing a 2000 Å amorphous carbon layer 225, a via through amorphous carbon layer 225 has a substantially anisotropic profile and $CD_E$ of approximately 50 nm.

At operation 140, of FIG. 1, the main etch is performed using the multi-layered mask having an opening with a reduced critical dimension, $CD_E$, from the polymerizing BARC etch. As represented by the dashed line in FIG. 1, the main etch may be performed immediately following the polymerizing BARC etch process if the multi-layered mask lacks the amorphous carbon layer and/or a DARC layer. In such an embodiment, the CD shrink from the BARC etch may still be leveraged to shrink the CD of the opening etched into the substrate layer.

Figure 2E:
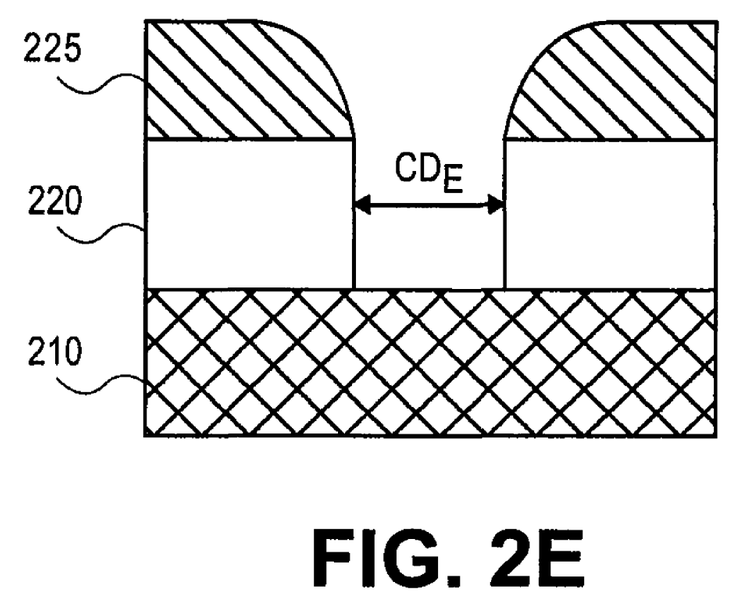
FIG. 2E illustrates a cross-sectional view of the substrate of FIG. 2A with an etched opening in a substrate layer patterned by the multi-layered mask in accordance with one embodiment of the present invention.
Figure 2F:
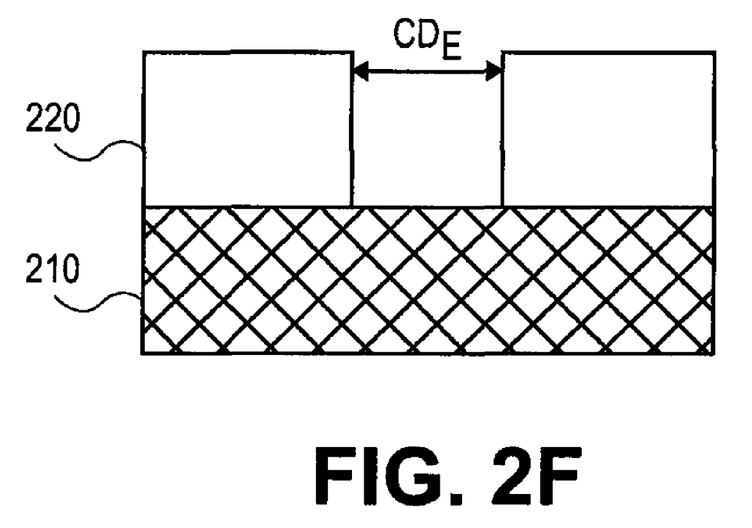
FIG. 2F illustrates a cross-sectional view of the substrate of FIG. 2A after removal of the multi-layered mask in accordance with one embodiment of the present invention.

As shown in FIG. 2E, the main etch uses a multi-layered mask including amorphous carbon to faithfully transfer a reduced critical dimension, smaller than $CD_L$, into substrate layer 220. Depending on the material composition of the layer, various known etch techniques and chemistries may be employed in the main etch, such as, but not limited to, a fluorine-based plasma etch of a silicon nitride or silicon oxide layer. In one embodiment, a dielectric layer is etched with a highly anisotropic process to have an opening with a critical dimension approximately equal to that of the BARC opening, or $CD_E$. In one such embodiment, the substrate layer is etched to have an opening with a $CD_E$ below 50 nm using a multi-layered mask having an opening lithographically defined with a $CD_L$ greater than 90 nm. In another embodiment, a dielectric layer is etched with a process providing a tapered via profile to have a bottom CD smaller than that of both the lithographically defined dimension, $CD_L$, and the BARC dimension, $CD_E$.

Finally, at operation 150, any remaining layer of the multi-layered mask is removed to conclude method 100 of FIG. 1. In one embodiment, an in-situ ash process is employed to remove multi-layered mask and may further be performed in the same etch chamber utilized for operations 125, 130, and 140. In a further embodiment, a high flow of $O_2$ is energized with a source power of at least 300 W while the bias power is less than 150 W. The high source power will erode remaining mask layer, such as amorphous carbon layer 225. The in-situ ash also prepares the etch system to repeat method 100 on another workpiece.

Figure 3:
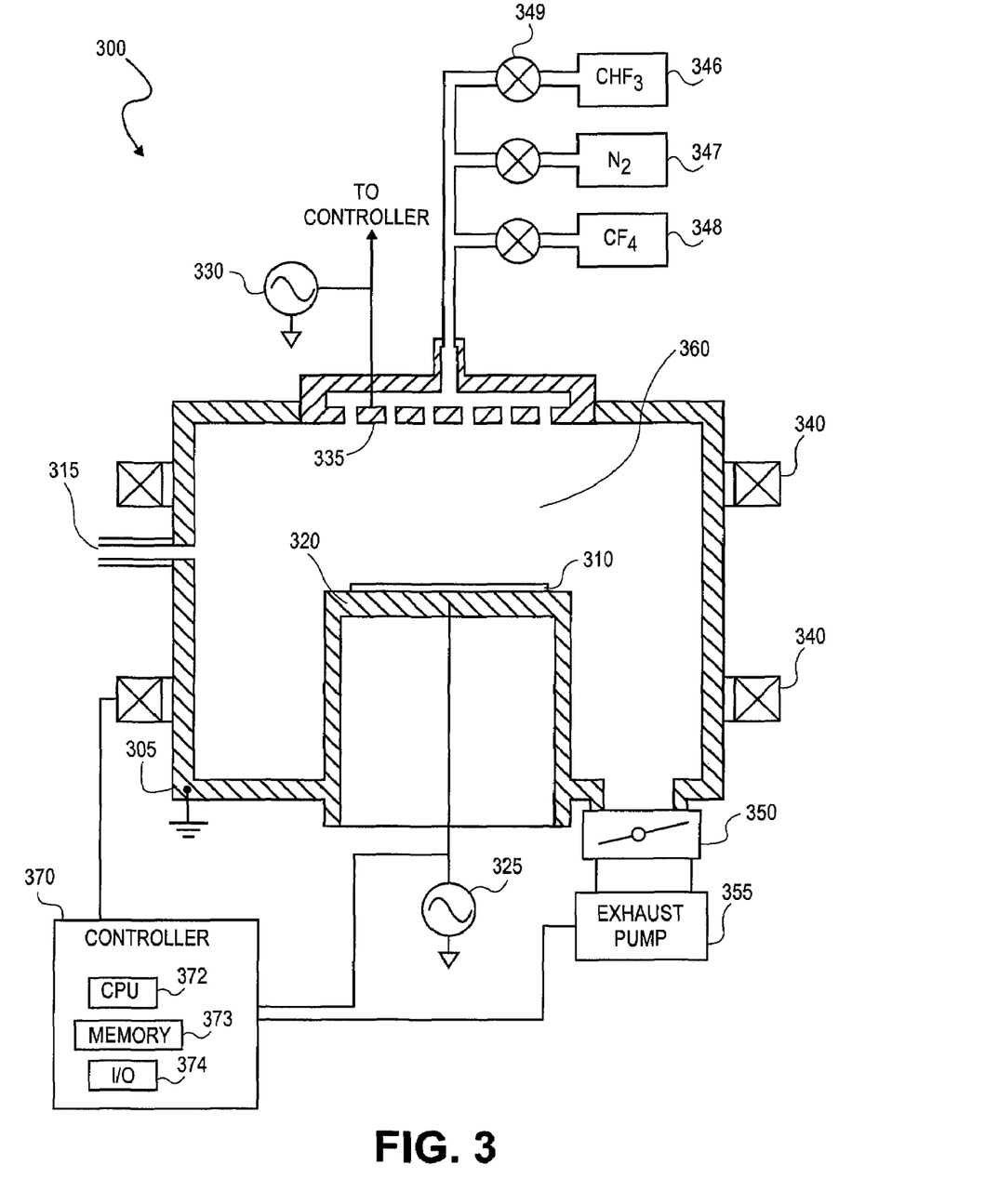
FIG. 3 is a cross-sectional schematic of a plasma etch system for performing methods in accordance with one embodiment of the present invention.

In an embodiment, the plasma etch processes of method 100 are performed in a etch system, such as the MxP®, MxP+™, Super-E™, eMAX® or Enabler™ system manufactured by Applied Materials of CA, USA. It is to be understood that other etch chambers can be used for practicing exemplary embodiments of the present invention. A cross-sectional view of an exemplary etch system 300 is shown in FIG. 3. System 300 includes a grounded chamber 305. A workpiece 310 is loaded through an opening 315 and clamped to a temperature controlled cathode 320. Process gases, $CHF_3$, $N_2$ and $CF_4$, employed in an embodiment of the BARC etch previously described, are supplied from sources 346, 347 and 348, respectively. The process gases are supplied from the source through respective mass flow controllers 349 to the interior of the chamber 305. Chamber 305 is evacuated to between 5 mTorr and 500 mTorr via an exhaust valve 350 connected to a high capacity vacuum pump stack 355 including a turbo molecular pump.

When RF power is applied, a plasma is formed in chamber processing region 360. In particular embodiments, magnetic coils 340 surround chamber 305 to provide a rotating magnetic field of between 0 G and 100 G to control the density of the plasma. Bias RF generator 325 is coupled to cathode 320. Bias RF generator 325 provides bias power to energize the plasma. Bias RF generator 325 typically has a frequency between about 2 MHz to 60 MHz, and in a particular embodiment, is 13.56 MHz. Source RF generator 330 is coupled to a plasma generating element 335 which is anodic relative to cathode 320 to provide source power to energize the plasma. In one embodiment previously described, the Enabler™ etch system provides a source RF generator operating at 162 MHz and a relatively low source power to shrink the CD of an opening during a BARC etch operation. Generally, bias power affects the bias voltage on workpiece 310, controlling ion bombardment of the workpiece 310, while source power affects the plasma density relatively independently of the bias on workpiece 310. As previously discussed in the context of the BARC etch operation 125 of FIG. 1, the etch performance of a given set of input gases from which the plasma is generated varies significantly with a plasma density and wafer bias, thus both the amount and origin of power (source or bias) energizing the plasma are important. In another embodiment previously described, an eMax™ etch system provides a source RF generator operating at 60 MHz and a relatively high source power to shrink the CD of an opening during a BARC etch operation.

Because electrode diameters have progressed over time, from 150 mm, 200 mm, 300 mm, etc., to accommodate a larger workpiece, it is common in the art to normalize the source and bias power of a plasma etch system to the electrode area. Throughout this specification, references to watts (W) should be considered in the context of a system designed with a 300 mm diameter round electrode and therefore all powers may be scaled to an appropriate electrode size and shape.

In an embodiment of the present invention, system 300 is computer controlled by controller 370 to control the bias power, source power, magnetic field strength, gas flows, pressure, cathode temperature, as well as other process parameters. Controller 370 may be one of any form of general-purpose data processing system that can be used in an industrial setting for controlling the various subprocessors and subcontrollers. Generally, controller 370 includes a central processing unit (CPU) 372 in communication with memory 373 and input/output (I/O) circuitry 374, among other common components. Software commands executed by CPU 372, cause system 300 to, etch BARC layers with a polymerizing process gas, such as $CHF_3$, at low pressure, such as 10 mT, and energized with a high frequency source power, such as 162 MHz, generating less than 400 W. Software commands executed by CPU 372, may further cause system 300 to etch amorphous carbon layers, etch dielectric layers, as wells as perform other processes in accordance with the present invention. Portions of the present invention may be provided as a computer program product, which may include a computer-readable medium having stored thereon instructions, which may be used to program a computer (or other electronic devices) to etch BARC layers with a polymerizing process gas at low pressure and energized with a high frequency capacitively coupled plasma source, etch amorphous carbon layers, etch dielectric layers, as wells as perform other processes in accordance with the present invention. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known type computer-readable medium suitable for storing electronic instructions. Moreover, the present invention may also be downloaded as a computer program product, wherein the program may be transferred from a remote computer to a requesting computer over a wire.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method comprising:
providing in a plasma etch chamber a substrate layer under a multi-layered mask, the multi-layered mask including an unpatterned organic anti-reflective layer below a layer patterned with an opening having a first critical dimension;
plasma etching through the organic anti-reflective layer with a plasma etching condition providing a negative etch bias to form an opening having a critical dimension at least 20% smaller than the first critical dimension, wherein the plasma etching condition deposits sidewall polymer during the etching of the organic anti-reflective layer to provide the negative etch bias; and
plasma etching into the substrate layer an opening having a critical dimension at least 20% smaller than the first critical dimension.

2. The method of claim 1, wherein the organic anti-reflective layer has a thickness between 100 and 800 Å, wherein the first critical dimension is less than 100 nm and the critical dimension of the opening etched in the organic anti-reflective layer is smaller than the first critical dimension by at least 30 nm.

3. The method of claim 1, further comprising plasma etching through an amorphous carbon layer an opening having a critical dimension at least 20% smaller than the first critical dimension, wherein the amorphous carbon layer is between the organic anti-reflective layer and the substrate layer.

4. The method of claim 3 wherein the source power is less than 350 W normalized to a 300 mm electrode.

5. The method of claim 1, wherein the plasma etching further comprises exposing the organic anti-reflective layer to a plasma of a polymerizing process gas comprising CHF3 energized with a capacitively coupled source power having a frequency of between 100 MHz and 180 MHz.

6. The method of claim 5, wherein the polymerizing process gas further comprises CF4.

7. The method of claim 6, wherein the CF4:CHF3 gas ratio is between 0.3:1 and 1.5:1.

8. The method of claim 1, wherein the plasma etching further comprises exposing the substrate to a plasma of a polymerizing process gas comprising CHF3 energized with a capacitively coupled source power having a frequency of between 60 MHz and 100 MHz.

9. The method of claim 8 wherein the source power is at least 400 W normalized to a 300 mm electrode.

10. The method of claim 1, wherein the chamber pressure is less than 25 mT.

11. A method comprising:
providing in a chamber a multi-layered mask including an unpatterned organic anti-reflective layer below a layer patterned with an opening having a first critical dimension;
providing in the chamber an etchant gas comprising $CHF_3$ at a pressure below 25 mT and;
etching through the unpatterned organic anti-reflective layer, with a plasma of the etchant gas, an opening having a critical dimension reduced from the first critical dimension by an amount of sidewall polymer deposited during the etching, wherein the etching further comprises depositing sidewall polymer during the etching of the organic anti-reflective layer to provide a negative etch bias.

12. The method of claim 11, wherein the critical dimension is reduced from the first critical dimension by at least 30 nm.

13. The method of claim 11, wherein the plasma is energized with power less than 350 W normalized to a 300 mm electrode through a capacitively coupled RF source having a frequency of approximately 162 MHz.

14. The method of claim 11, wherein the plasma is energized with power greater than 400 W normalized to a 300 mm electrode through a capacitively coupled RF source having a frequency of approximately 60 MHz.

15. The method of claim 11, wherein the etchant gas further comprises $CF_4$.

16. The method of claim 15, wherein the $CF_4$:$CHF_3$ gas ratio is between 0.3:1 and 1.5:1.

17. The method of claim 11, further comprising, after etching through the organic antireflective layer, etching through an amorphous carbon layer of the multi-layered mask an opening having a critical dimension approximately equal to the critical dimension of the opening in the organic antireflective layer, wherein the etching occurs under different process conditions than those used for etching the organic anti-reflective layer.

18. The method of claim 11, further comprising, after etching through the unpatterned organic antireflective layer, etching into a dielectric layer patterned by the multi-layered mask an opening in the dielectric layer having a critical dimension approximately equal to the critical dimension of the opening in the organic antireflective layer.

* * * * *